United States Patent
Cobbley et al.

(10) Patent No.: US 6,440,777 B2
(45) Date of Patent: *Aug. 27, 2002

(54) METHOD OF DEPOSITING A THERMOPLASTIC POLYMER IN SEMICONDUCTOR FABRICATION

(75) Inventors: Chad A. Cobbley; Tongbi Jiang, both of Boise; John Vannortwick, Kuna, all of ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/826,178

(22) Filed: Apr. 4, 2001

Related U.S. Application Data

(63) Continuation of application No. 08/915,211, filed on Aug. 20, 1997, now Pat. No. 6,238,223.

(51) Int. Cl.$^7$ ............................................. H01L 21/44
(52) U.S. Cl. .................... 438/118; 438/119; 438/125
(58) Field of Search ............................. 438/118, 119, 438/123, 124, 125, 126, 127

(56) References Cited

U.S. PATENT DOCUMENTS

| | | |
|---|---|---|
| 4,627,988 A | 12/1986 | Spanjer |
| 4,798,694 A | 1/1989 | Sugata et al. |
| 4,906,314 A | 3/1990 | Farnworth et al. |
| 5,126,085 A | 6/1992 | Thorp et al. |
| 5,128,380 A | 7/1992 | Mori et al. |
| 5,169,911 A | 12/1992 | Lupinski et al. |
| 5,220,724 A | 6/1993 | Gerstner |
| 5,268,048 A | 12/1993 | Leibovitz et al. |
| 5,286,679 A | 2/1994 | Farnworth et al. |
| 5,296,559 A | 3/1994 | Gebhardt et al. |
| 5,348,607 A | 9/1994 | Wojnarowski et al. |
| 5,350,811 A | 9/1994 | Ichimura et al. |
| 5,475,048 A | 12/1995 | Jamison et al. |
| 5,554,684 A | 9/1996 | Choi et al. |
| 5,579,573 A | 12/1996 | Baker et al. |
| 5,627,108 A | 5/1997 | Alibocus et al. |
| 5,668,059 A | 9/1997 | Christie et al. |
| 5,677,246 A | 10/1997 | Maeta et al. |
| 5,846,851 A | 12/1998 | Sasaki et al. |
| 6,238,223 B1 * | 5/2001 | Cobbley et al. ............ 438/119 |

OTHER PUBLICATIONS

J. Lau, "Chapter 1—A Brief Introduction to Flip Chip Technologies for Multichip Module Applications", *Flip Chip Technologies*, McGraw–Hill, Title page, Copyright page, and pp. 1, 46–87 (1996).

J. Rosenfeld et al., "Poly(imide Siloxane)s", *Polymeric Materials Enc.*, 8, pp. 6198–6213 (1996).

* cited by examiner

*Primary Examiner*—Kevin M. Picardat
(74) *Attorney, Agent, or Firm*—Mueting, Raasch & Gebhardt, P.A.

(57) ABSTRACT

A method of applying a dispersion (which may be in the form of a paste) of particles of a thermoplastic polymer in a liquid medium (i.e., liquid carrier) onto semiconductor wafers, dies, lead frames, and printed circuit boards, for example, to form bonding layers, pads, and bumps, etc.

24 Claims, 9 Drawing Sheets

FIGURE 3
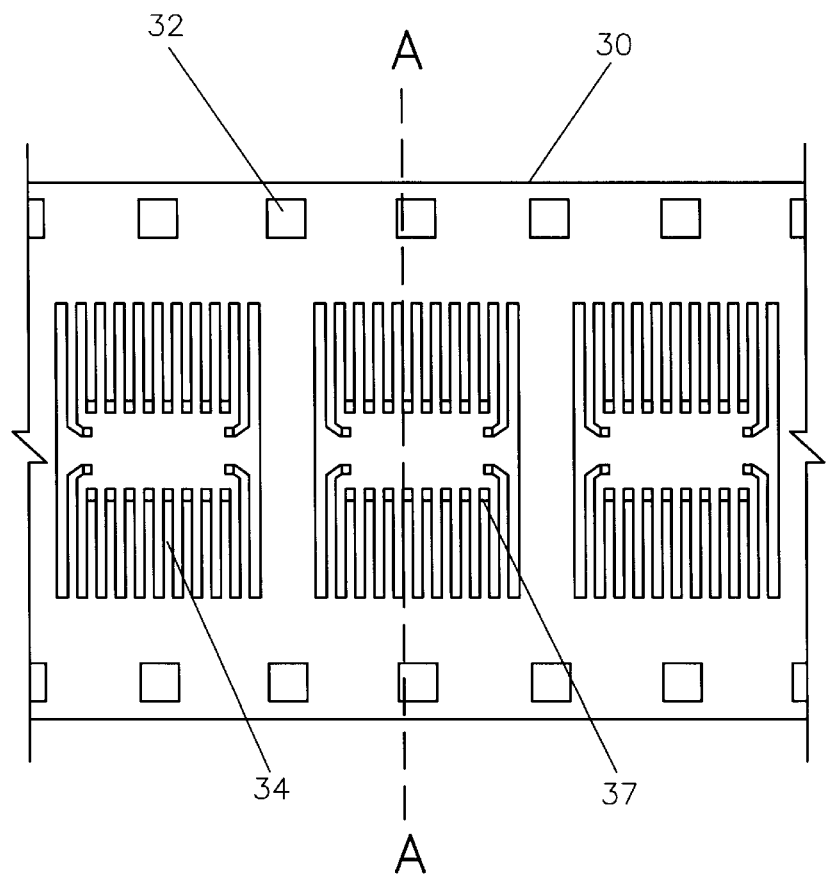
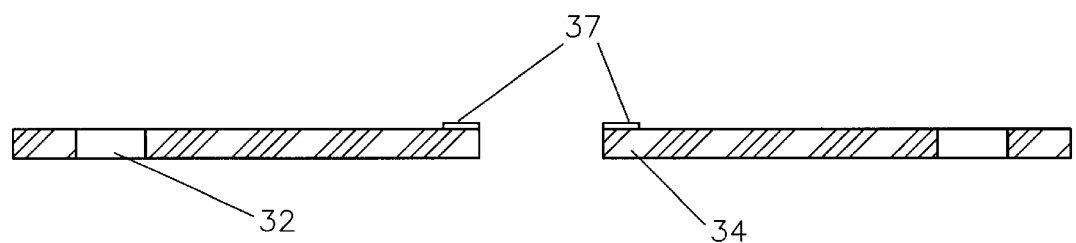
FIGURE 3a

METHOD OF DEPOSITING A THERMOPLASTIC POLYMER IN SEMICONDUCTOR FABRICATION

This is a continuation of the application Ser. No. 08/915,211, filed Aug. 20, 1997, now at the 6,238,223, which is incorporated herein by reference.

FIELD OF THE INVENTION

The present invention relates to semiconductor fabrication. Specifically, it relates to a process of forming protective coatings, adhesive layers, bonding layers, pads, and bumps for die attachment applications as well as board level packaging using a dispersion of a thermoplastic polymer.

BACKGROUND OF THE INVENTION

Semiconductor packaging involves a variety of processes that require the formation of protective coatings, adhesive layers, bonding layers, pads, and bumps for die attachment applications as well as board level packaging. For example, in semiconductor packaging, a single semiconductor die is typically mounted within a sealed package. In general, the package protects the die from damage and from contaminants in the surrounding atmosphere. The package also provides a system for connecting the electrical devices formed on the die to a printed circuit board or other external circuitry.

The packaging process involves adapting a leadframe (i.e., a metal frame which supports several dies for packaging and provides the leads for the final semiconductor package) to mount several semiconductor dice. Each die has a lower surface (i.e., the back of the die) that is devoid of circuitry, and an upper surface (i.e., the face of the die) having integrated circuitry constructed thereon. The integrated circuitry is electrically accessible via bonding pads which may be arranged in a variety of configurations on the face or edges of the die. During conventional packaging processes, each die is attached to a mounting paddle of the leadframe by an adhesive layer. Adhesives which have been used for this include epoxy, acrylic, silicone, and polyimide materials which are sandwiched between the bottom of the die and the mounting paddle.

During the packaging process, the bond pads formed on the die are electrically connected to the leads of the leadframe using fine bond wires. Following the application of a polyimide protective layer to the face of the die, it, and a portion of the leadframe to which it is attached, is encapsulated in a plastic material, as are all other die/leadframe assemblies on the leadframe strip.

After encapsulation, a trim and form operation separates the resultant interconnected packages and bends the leads of each package into the proper configuration. There is a need in the art for improved methods of attaching semiconductor dies to leadframes and for attaching dies to a printed circuit board.

Recent advances in semiconductor manufacture have lead to higher circuit densities and improved packaging technologies. Some high density circuits use a lead-on-chip (LOC) packaging technology. In general, an LOC die is formed without a mounting paddle for the die. The lead fingers of the leadframe not only electrically attach to the bond pads via the bond wires but also adhere to the face of the die and support it during the encapsulation process. Polymers typically are used as the adhesive for the die and for the necessary structural support.

In addition to the attachment of leads, there is the attachment of dies to printed circuit boards. Chip-on-board (COB) is a term referring to the direct attachment of bare chips onto printed circuit boards (PCBs) by die attach, tape automated bonding (TAB), or flip chip methods. TAB is a technique which allows automation of the bonding of one end of a lead to a semiconductor chip and the other end directly to a printed circuit board. TAB is characterized by formation of a conductive bonding projection or "bump" between the chip and the lead. The bump provides the necessary bonding as well as a physical standoff, which prevents lead/chip shorting. Typically the bumps comprise metals, such as gold alloys.

For flip chip applications, one or more beads of solder (i.e., a bump) are applied to the surface of a die (i.e., that surface having electronic circuitry) and the chip is then flipped over onto the surface of a PCB. Interspersed between bumps is underfill material designed to seal the area between the die and the PCB. Bump dams are also used on flip chips to prevent solder flow and electrical shorting.

Solder paste is a common interconnecting material for packaging applications. Solder paste is a mixture of fusible metal powder, fluxes, activators, solvents, binders, etc. Solder paste is thick and tacky, allowing parts to be held in position without additional adhesives before permanent electrically conductive bonds are formed in the solder reflow process. Typically, solder is delivered to the surface in a desired pattern by screen printing and metal stencil printing. The use of solder paste can be undesirable because the surface can be difficult to clean and because of the presence of heavy metals, such as lead, in the solder.

Other materials used for attaching and electrically connecting parts in semiconductor fabrication, particularly semiconductor packaging, include heat activated adhesive tapes, thermoset adhesives (typically cured after delivery to the surface), and solutions of thermoplastic adhesives.

Adhesive tapes are cut to desired sizes and shapes and applied to a surface. For example, U.S. Pat. No. 4,906,314 (Farnworth et al) describes a method of die attach wherein a polymer coated tape is applied to a surface and heat activated. This method is limited to the shapes and sizes which can be cut from such tape.

Adhesives can also be applied by printing methods (e.g., screen printing and stencil printing). For example, U.S. Pat. No. 5,220,724 (Gerstner) describes the use of a reworkable thermoplastic adhesive to mount surface-mounted devices on a substrate. The adhesive is warmed to make it fluid and is applied to a surface by screen printing. U.S. Pat. No. 5,286,679 (Farnworth, et al) describes a method of attaching a die to the lead fingers of a leadframe using either thermoplastic or thermoset adhesive. The adhesive is dried (if thermoplastic) or cured (if thermoset) after application. The adhesive layer is patterned by hot or cold screen printing, by photopatterning a photosensitive adhesive, or by utilizing a resist method of etch back. However, with these methods, adhesive application can be difficult because the proper viscosity and rheology of the liquid adhesive must be maintained in a narrow range to work properly. In addition, the thickness of the adhesive layer (followed by curing) can be undesirably low for some applications.

Thus, there is also a need for improved methods of forming adhesive layers, bumps, and pads on the surface of dies, leadframes, and printed circuit boards. There is also a need in the art to conveniently deposit materials by screen or stencil printing in semiconductor packaging applications, where such materials would not damage the screen or reduce its working life. There is also a need to develop reliable bonding materials which provide good performance properties as well as exhibit economical processing features.

SUMMARY OF THE INVENTION

The present invention provides a method of applying a dispersion (which may be in the form of a paste) of particles of a thermoplastic polymer in a liquid medium (i.e., liquid carrier) onto semiconductor wafers, dies, lead frames, and printed circuit boards, for example, to form bonding layers, pads, and bumps, etc. The method of the present invention is useful in applications such as surface mount attachment of devices to printed circuit boards, chip-on-board (COB), lead on chip (LOC), direct chip attach (DCA), and ball grid arrays (BGA).

The method of the present invention preferably involves applying a dispersion of a thermoplastic polymer, such as a polyimide, using a printing method such as screen printing or stenciling. Typically, the method of the present invention does not use solvents that can adversely affect the screen. Rather, preferred liquid carriers include low boiling solvents such as water or alcohol. The method of the present invention is particularly advantageous because these liquid carriers can involve fewer environmental concerns. Further, the working life of the dispersion used in screen printing is increased because the thermoplastic polymer does not cure as the solvent evaporates.

Using a dispersion of a thermoplastic polymer, screen cleaning frequencies are also reduced because the dispersion is not sticky and smearable, therefore the screens are easier to clean. Furthermore, the method of the present invention allows for the application of more consistent coating weights than are possible using conventional methods. This method also allows for a higher throughput and therefore better efficiency and economy in producing semiconductor packages, for example.

In another aspect, the method of this invention comprises applying a thermoplastic polymer to a leadframe comprising lead fingers by applying a thermoplastic dispersion to the lead fingers, and drying the thermoplastic dispersion.

In another aspect, the method of this invention comprises attaching a die to a leadframe, the leadframe comprising lead fingers, applying a thermoplastic dispersion to the lead fingers; drying the thermoplastic dispersion; heating the thermoplastic dispersion to form a thermoplastic bonding layer, and placing a die against the bonding layer, thereby attaching the die to the leadframe.

In another aspect, the method of this invention comprises applying a thermoplastic polymer to a printed circuit board by applying a thermoplastic dispersion in a predetermined pattern to a printed circuit board, and drying the thermoplastic dispersion.

In another aspect, the method of this invention comprises attaching a die to a printed circuit board, by applying a thermoplastic dispersion in a predetermined pattern to a printed circuit board to produce an area to accept a die; drying the thermoplastic dispersion; heating the thermoplastic dispersion to form a thermoplastic bonding layer, and placing die against the bonding layer, thereby attaching the die to the printed circuit board.

In another aspect, the method of this invention comprises sealing a flip chip on a printed circuit board, the flip chip comprising a plurality of conductive bumps, by placing a flip chip on a printed circuit board, thus forming voids; applying a thermoplastic dispersion to the voids; drying the thermoplastic dispersion; heating the thermoplastic dispersion to form a thermoplastic underfill material, thereby sealing the flip chip to the printed circuit board.

In another aspect, the method of this invention comprises applying a thermoplastic polymer to a flip chip, the flip chip comprising a plurality of conductive bumps and spaces between the bumps, by applying a thermoplastic dispersion in the spaces between the bumps, and drying the thermoplastic dispersion;

In another aspect, the method of this invention comprises making thermoplastic bump dams on a flip chip, the flip chip comprising a plurality of conductive bumps and spaces between the bumps, by applying a thermoplastic dispersion in the spaces between the bumps, and drying the thermoplastic dispersion; and heating the thermoplastic dispersion to form thermoplastic bump dams.

In another aspect, the method of this invention comprises making an array (e.g., a ball grid array), the array comprising a plurality of conductive thermoplastic deposits on the surface of a substrate of an integrated circuit package, by applying a thermoplastic dispersion to form deposits; drying the thermoplastic dispersion, and heating the thermoplastic dispersion to form conductive thermoplastic deposits (e.g., bumps, piles, etc.).

In another aspect, this invention comprises a semiconductor component (such as those described above) having applied thereon a dispersion comprising thermoplastic particles and a liquid medium.

In another aspect, this invention comprises a leadframe comprising lead fingers having applied thereon a dispersion comprising thermoplastic particles and a liquid medium.

In another aspect, this invention comprises a printed circuit board having applied thereon a dispersion comprising thermoplastic particles and a liquid medium.

In another aspect, this invention comprises a flip chip comprising a plurality of conductive bumps and spaces between the bumps, having applied thereon a thermoplastic dispersion in the spaces between the bumps.

In another aspect, this invention comprises a flip chip mounted on a printed circuit board having voids between the flip chip and the printed circuit board, having applied to the voids a dispersion comprising thermoplastic particles and a liquid medium.

In another aspect, this invention comprises an integrated circuit package molded body having applied thereon a dispersion comprising thermoplastic particles and a liquid medium.

BRIEF DESCRIPTION OF THE DRAWINGS

FIG. 3 is an illustrative diagram showing a metal leadframe with a bonding layer on the lead fingers, as shown further in cross section in FIG. 3A.

DETAILED DESCRIPTION OF PREFERRED EMBODIMENTS

Figure 1:
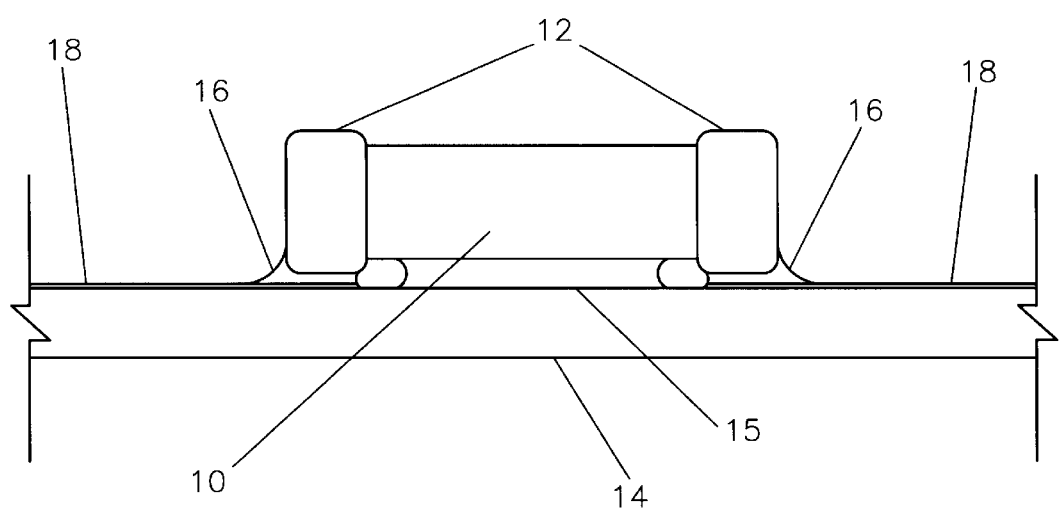
FIG. 1 is an illustrative diagram showing a device mounted on a printed circuit board.

The present invention provides a method of applying a thermoplastic polymer in the form of a dispersion in a desired pattern on semiconductor components. In this application, "semiconductor components" refers to semiconductor substrates or substrate assemblies, including any of the layers or structures thereon, such as dice, lead frames, lead fingers, wire bonds, printed circuit boards, and surface mount devices. Thus, the term "semiconductor component" includes protective coatings, bonding layers (e.g., die attach adhesive), bumps, pads (e.g., for wire bonding), and ball grid arrays in various semiconductor fabrication applications, particularly semiconductor packaging applications.

The method of the present invention is particularly well suited for applying structures on a surface of a semiconductor substrate such as a silicon wafer used in forming integrated circuits. Further, it is particularly well suited for applying structures in a desired arrangement and in desired locations (i.e., in a predetermined pattern) on a semiconductor substrate. It is to be understood that the method of the present invention is not limited to deposition on silicon wafers; rather, other types of materials (e.g., gallium arsenide, ceramic, etc.) can be used as well. If the substrate is a semiconductor wafer, the thermoplastic polymer can be applied directly on the bare surface of the wafer, or it can be formed on any of a variety of the layers (i.e., surfaces) in a patterned wafer, for example.

In the present invention, a stable dispersion of thermoplastic particles in a liquid medium is applied in a desired pattern. After deposition, the article is dried to remove the liquid medium. This can be done simply by allowing the liquid medium (i.e., liquid carrier) to evaporate at room temperature, or by applying heat or a vacuum to drive off the liquid medium. The article can be heated sufficiently to melt the thermoplastic particles, depending on the application and desirability for such. The deposited and dried dispersion, which may be conductive or nonconductive, is useful as various structures on the semiconductor components.

The term "dispersion" as used herein refers to a stable suspension of finely divided thermoplastic particles in a liquid medium. The thermoplastic particles are substantially insoluble in the fluid medium. The thermoplastic particles also are substantially polymerized or crosslinked before formation of the dispersion. That is, no further reaction of the polymer (other than fusing or melting to form a film, for example,) occurs after the dispersion is coated and/or dried or heated. The particles in the dispersion preferably are less than about 250 microns in diameter. More preferably, the particles range in size from about 3 microns to about 250 microns.

In a stable dispersion (i.e., suspension), the particles do not settle out of the liquid medium rapidly. That is, they generally remain in suspension for a sufficient amount of time to apply the dispersion to the desired substrate. To be useful for most applications, which typically involve screen printing or stenciling, the dispersions are preferably stable for a period of at least about 48 hours at 25° C., and more preferably, for about 1 year at −40° C.

A stable dispersion is typically also not readily filterable to remove the particles. The solids content of the dispersion is preferably at least about 20 percent solids by weight, and more preferably, at least about 50 percent solids by weight, and most preferably, at least about 95 percent solids by weight, based on the total weight of the dispersion.

The viscosity of the dispersion of particles of a thermoplastic polymer in a liquid medium (i.e., the thermoplastic dispersion) is preferably such that the dispersion can be conveniently applied by pattern coating techniques. More preferably, the viscosity of the dispersion ranges from about 10,000 centipoise at 25° C. to about 300,000,000 centipoise at 25° C. In particularly preferred embodiments, the dispersion is thick, similar to a paste.

"Thermoplastic" polymers soften when exposed to heat and return to their original condition when cooled to room temperature. Natural substances that exhibit this behavior are crude rubber and a number of waxes; however, the term is usually applied to synthetics such as polyvinyl chloride, nylon, fluorocarbons, linear polyethylene, polyurethane prepolymer, polystyrene, polypropylene, and cellulosic and acrylic resins. This is distinct from "thermoset" polymers, which cure or "set" upon heating, and cannot be returned to a plastic state by heating. Thermoplastic polymers are commercially available in various forms, such as powders and pellets. They can be elastomeric. "Elastomer" is a term referring to polymers having properties similar to those of vulcanized natural rubber, namely the ability to be stretched to at least twice their original length and to retract very rapidly to approximately their original length when released. The term includes uncrosslinked polyolefins that are thermoplastic; these are referred to as thermoplastic olefin rubbers. The thermoplastic polymer may also contain unreacted monomeric components and other materials which do not adversely affect the properties of the final dried thermoplastic polymer.

Suitable thermoplastic polymers for use in the method of the present invention include high and low density polyethylene, ethylene/vinylacetate copolymer (EVA), polypropylene, polystyrene, acrylonitrile-butadiene-sytrene (ABS), poly(vinyl butyral) (PVB), poly(vinyl chloride (PVC), polyirnide, polyamide, poly(methyl methacrylate), poly(ethylene terephthalate), and cellulose acetate.

A preferred thermoplastic polymer for the practice of the present invention is a polyimide. Polyimides are generally prepared in a polar solvent, such as N-methyl pyrrolidone, at room temperature, by the addition of a dianhydride to a solution of a diamine (such as poly(amic acid)) and allowed to stir for several hours under moisture-free conditions. This solution is cured (i.e., fully reacted) and made into the desired form. Finely divided fully imidized polymer suitable for practice in the present invention include polyimide particles commercially available from Dexter Composites of Cleveland, Ohio, as "M100."

In a more preferred embodiment of the present invention, the polyimide contains siloxane functionality (a class of compounds having a Si—O—Si bond) as is known in the art. Siloxane is incorporated into the polyimide by reacting siloxane-containing compounds with poly(amic acid) to form poly(imide siloxane). Siloxanes are known to alter the properties (e.g., flow, compliance, modulus) of the polyimides. For example, at low siloxane content (about 10% by weight), a poly(imide siloxane) is rigid and more like a polyimide. As the siloxane content increases, flexibility also increases. At levels above about 40% siloxane, siloxane is the continuous phase and the materials are characterized as thermoplastic elastomers.

The liquid medium can be any liquid suitable for making a dispersion of particles of the thermoplastic polymers.

Preferably, such liquids not only make stable suspensions, but also do not adversely affect the printing apparatus (such as the screen for screen printing), and they also evaporate at low temperatures (i.e., up to about 200° C.). Suitable liquid media include, for example, water, organic solvents, and liquid thermoset components. Preferably, the liquid media include one or more low boiling solvents (i.e., those having a boiling point of no greater than about 200° C.). More preferably, the liquid media include water and alcohols. Although water and organic solvents are desired, and low boiling solvents are preferred, the liquid medium may also include monomers and/or polymers such as those in a liquid thermoset composition in amounts up to about 50 percent of the thermoplastic particles. If present in the dispersion, the liquid thermoset composition cures upon heating. The presence of the liquid thermoset can be advantageous in producing better adhesion of the thermoplastic dispersion to a substrate.

The dispersion of the present invention may also include filler particles in the form of powders, flakes, and fibers. Fillers can be added to adjust viscosity or to provide desirable properties to the dispersion and/or resultant coating, such as conductivity, color, opacity, etc. Fillers include such materials as particles of polymers, intermetallics, metals (including metalloids), and metal compounds (including metalloid compounds such as silicon carbide and silica). Fillers can be added to impart electrical conductivity (e.g. silver, aluminum, iron, nickel, graphite and metal-coated particles of non-conductive materials) or to impart thermal conductivity without electrical conductivity (e.g., aluminum nitride, alumina, and boron nitride). The amount of filler can range from about 1 percent by weight to about 85 percent by weight. For applications in which an electrical connection is made, high percentages of filler are used; whereas for adhesive applications, low percentages typically are used.

Other additives can be incorporated into the dispersions of the present invention. Such additives can be added during the preparation of the dispersion just prior to application. Alternatively, additives commonly incorporated in commercially available thermoplastic materials can be incorporated into the dispersions. However they are added, additives include antistatic agents, colorants, flame retardants, lubricants, plasticisers, and stabilizers.

To prepare the dispersion, thermoplastic particles in the desired size range are mixed together with the liquid medium by stirring. Fillers and/or other additives can be similarly added.

The dispersion can be applied by a wide variety of methods, particularly a pattern coating technique, such as mesh screen printing, metal stencil printing, pneumatic dot dispensing, positive displacement dispensing, or pin transfer techniques.

The dispersion can be applied in a desired pattern by these techniques to areas on a semiconductor wafer or die, printed circuit board, lead frames, and other substrates in a predetermined pattern. "Predetermined pattern" refers to a desired arrangement of areas having applied thereon the dispersion of this invention. For example, on a semiconductor wafer (which may have electronic circuitry thereon), a predetermined pattern is one in which there are uncoated areas and areas coated with the thermoplastic dispersion.

Preferred methods of applying the thermoplastic dispersion include screen printing and stencil printing. In screen printing, there is a means for mounting a patterned screen, a means for bringing an article to be printed into registration with the pattern on the screen, and a means for forcing material through the screen onto the article to be printed. Screens typically are fabricated from stainless steel, polyester, or nickel and have openings ranging in size from about 2.5 microns (0.1 mil) to about 12.7 millimeters (500 mils). Preferably, the screen printing apparatus is capable of repeatedly positioning the article to be printed in registration with the pattern on the screen to a resolution of approximately 10 microns. An advantage to the present invention is that no preparation of the screen is required before printing. That is, it does not need to be coated or treated and it can be used repeatedly because the dispersion does not clog up the screen.

In stencil printing, a pattern is formed on the surface of a substrate by forcing the thermoplastic dispersion through a template containing openings in the shape of the desired pattern. Stencils typically have larger openings than screens, although these terms are often used interchangeably. The template is placed over the surface of the substrate on which the pattern is to be formed and the dispersion is forced through the template by a squeegee blade or other means.

After application of the thermoplastic dispersion in the desired pattern, the patterned article is dried and/or heated to remove the liquid medium. The article is typically first dried at room temperature (typically about 25° C. to about 30° C.). If so desired, the thermoplastic particles can then be heated. The temperature at which the dispersion or dried polymer particles are heated is sufficient to cause melting of the particles and fusing into a uniform film. Preferably, the dispersion or dried particles are exposed to a temperature of no greater than about 500° C., for a time sufficient to melt the particles. The thermoplastic particles melt to produce consistent, reproducible, good quality films in the printed regions.

The preferred method for depositing a patterned layer of the thermoplastic dispersion is stencil printing. The preferred method for depositing bump dams is stencil printing. To deposit the thermoplastic dispersion in the shape of balls, useful for ball grid arrays, stencil printing, dot dispensing, positive displacement printing and pin transfer techniques can also be used to deposit balls. Pin transfer techniques can be used to deposit line patterns.

The method of the present invention produces structures on semiconductor components such as protective coatings, bonding layers, pads, bumps, and ball grid arrays for semiconductor fabrication, particularly semiconductor packaging, applications. These structures may be conductive or nonconductive, depending upon the desired application.

The method of the present invention is particularly useful for mounting electronic components (e.g., surface mount resistors, capacitors, integrated circuits, diodes) to printed circuit boards. This method is useful in leadon-chip (LOC) applications (e.g., bonding of leads to chips and leadframes), chip on board (COB) applications (e.g., die attach adhesives, wire bonding, tape automated bonding (TAB)), and for use in making flip chip conductive bumps, flip chip underfill, bump dam material, and ball grid array bumps. The method of the present invention can be used to produce the articles illustrated in the Figures and described below, but is not limited to these illustrations.

Referring now to FIG. 1, a device (e.g., a resistor, a capacitor, an integrated circuit, or a diode which is designed to be surface mounted) 10, having solder terminations 12, is mounted on a printed circuit board 14 by nonconductive thermoplastic bonding layer 15. Nonconductive thermoplastic bonding layer 15 holds device 10 in place for subsequent processing (e.g., solder reflow). Solder 16 makes electrical connection with PCB circuit trace 18. Nonconductive bonding layer 15 is deposited from the thermoplastic dispersion according to this invention, preferably using screen printing or stenciling, then dried and heated to form bonding layer 15.

Figure 2:
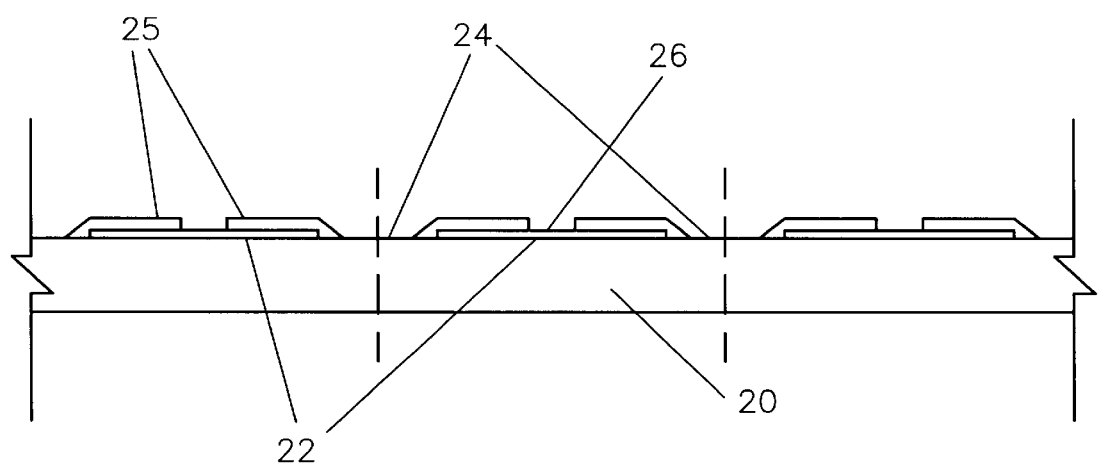
FIG. 2 is an illustrative diagram showing a cross section of a semiconductor substrate assembly coated with a patterned bonding layer in accordance with the method of the present invention.

Referring now to FIG. 2, a cross section of semiconductor wafer 20 is shown with a plurality of dice 22, and a plurality of streets 24 between dice 22. The thermoplastic dispersion of this invention is deposited in a desired, predetermined pattern, typically by stencil printing, then dried and heated to form thermoplastic bonding layer 25. The pattern is such that streets 24 and pad area 26 are free of thermoplastic bonding material. Thus semiconductor wafer 20 is ready for saw cutting through streets 24 (referred to as singulation). Pad area 26 will be used to make electrical connections during subsequent wire bonding.

Referring now to FIG. 3, a metal leadframe 30 is shown with drive sprocket holes 32, which facilitate indexing with automated packaging machinery. Leadframe 30 includes a plurality of generally parallel and spaced lead fingers 34. Lead fingers 34 can be coated by dot dispensing or stencil printing with the thermoplastic dispersion of this invention, which is then dried and heated to form a nonconductive thermoplastic bonding layer 37. Lead fingers 34 are shown further in cross section (taken along line A—A) in FIG. 3A. Thermoplastic bonding layer 37 is applied according to the method of the present invention. A die (not shown) will be positioned on leadframe 30 during manufacture and held in place by bonding layer 37 on lead fingers 34. After the die is in place, electrical connection will occur by means of wire bonds.

Figure 4:
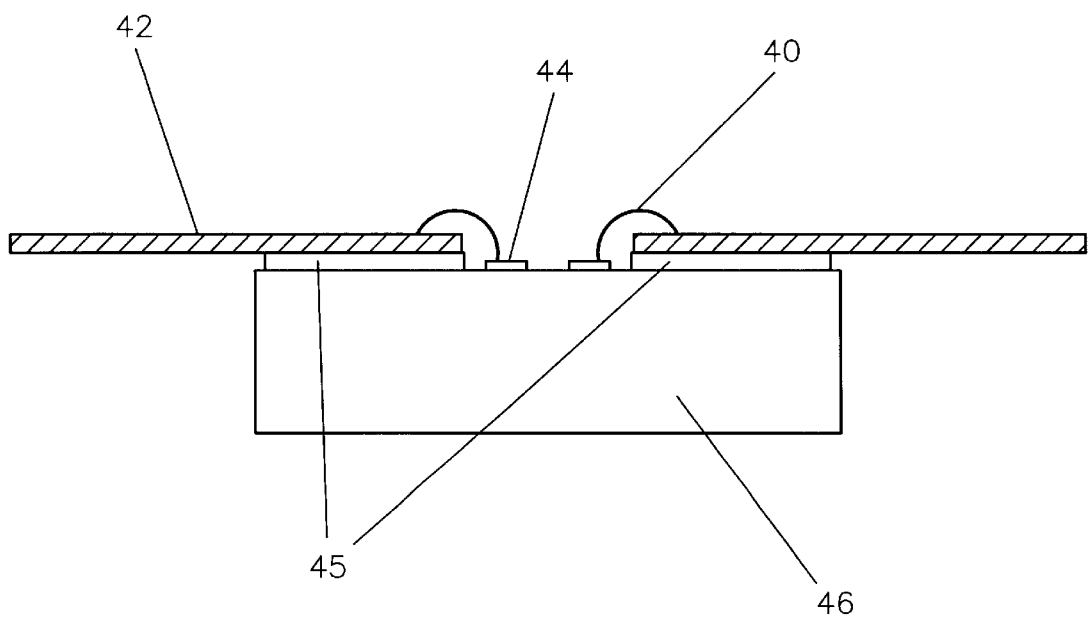
FIG. 4 is an illustrative diagram showing attachment of lead fingers and bond wires to a single semiconductor die.

Referring now to FIG. 4, wire 40 is attached to lead finger 42 and conductive (metal) bond pad 44 by, for example, thermocompression bonding. Lead finger 42 is held in place on die 46 by means of nonconductive thermoplastic bonding layer 45. The thermoplastic dispersion of this invention is deposited, typically by screen printing, in desired areas on the die, then dried and heated to form bonding layer 45.

Figure 5:
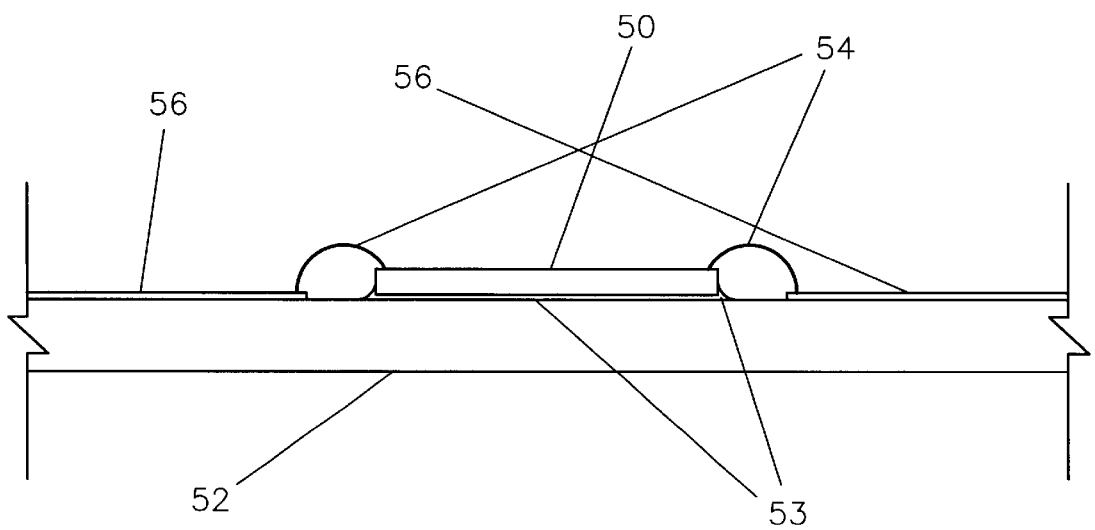
FIG. 5 is an illustrative diagram showing a die attached to a printed circuit board.

Referring now to FIG. 5, die 50 is shown attached to printed circuit board 52 by means of conductive die attach thermoplastic bonding layer 53. A thermoplastic dispersion having conductive filler therein is applied to printed circuit board 52, typically by screen printing, in a desired, predetermined pattern. The dispersion is dried and heated to form thermoplastic bonding layer 53. Die 50 is placed onto thermoplastic bonding layer 53. Wire bond 54 connects the surface of die 50 to circuit trace 56 on printed circuit board 52.

Figure 6:
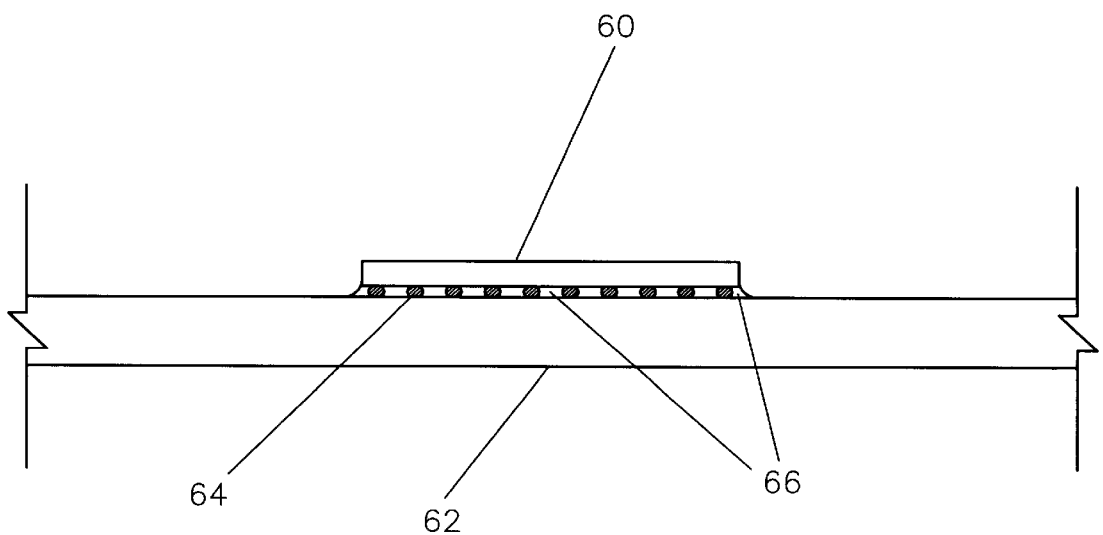
FIG. 6 is an illustrative diagram showing non-conductive flip chip underfill material and conductive flip chip bumps on a printed circuit board.

Referring now to FIG. 6, there is integrated circuitry (not shown) on the surface of chip 60 which is facing printed circuit board 62. Chip 60 on board 62 is shown in cross section. Chip 60 is held in place by means of a plurality of conductive flip chip bumps 64 thus forming voids between chip 60 and printed circuit board 62. The thermoplastic dispersion of this invention is applied to the voids, dried, and heated, to form thermoplastic nonconductive flip chip underfill material 66. Underfill material 66 serves to seal the area between chip 60 and printed circuit board 62. Flip chip bumps 64 can be made of solder or can be deposited from the thermoplastic dispersion of this invention by dot dispensing, pin transfer techniques and stencil printing methods, then drying and heating to form bumps 64.

Figures 7A, 7B:
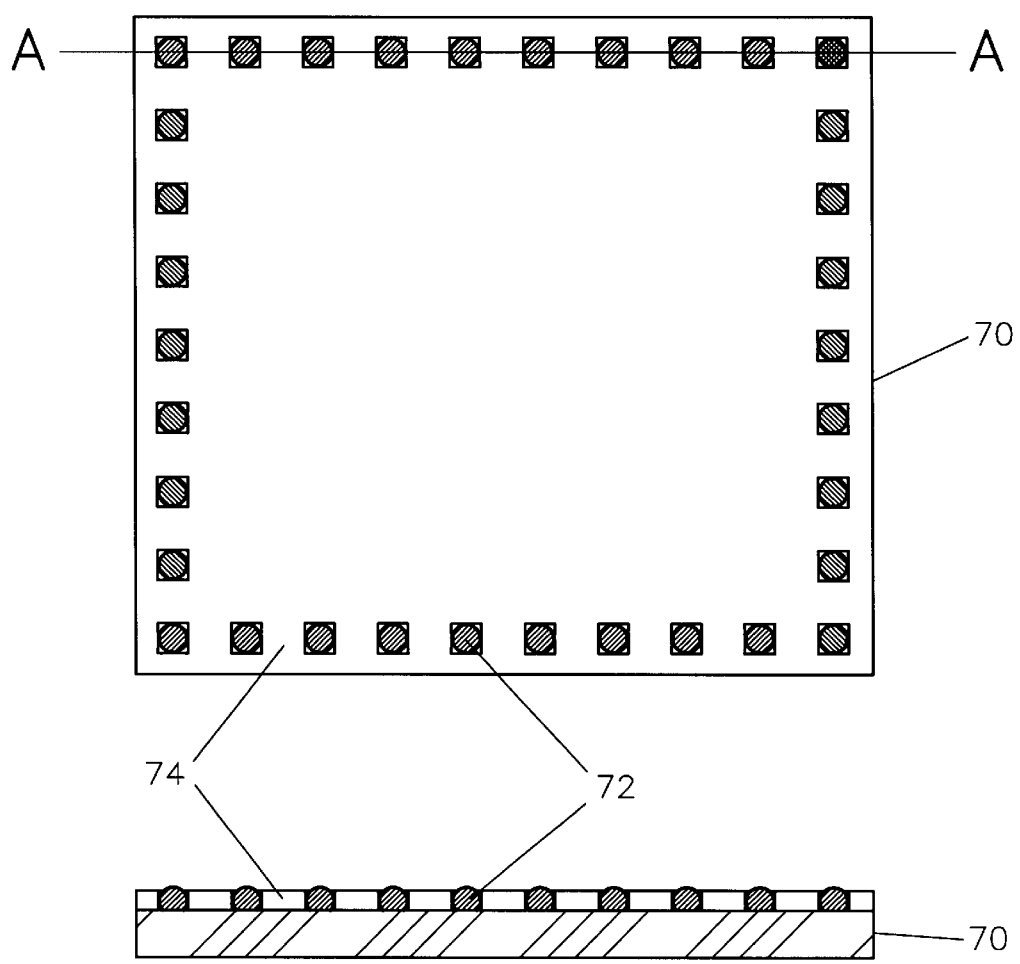
FIGS. 7A and 7B are an illustrative diagram showing conductive bumps on a flip chip.

Referring now to FIG. 7, the surface of a flip chip 70 is shown with conductive bumps 72 distributed about the edges of chip 70. FIG. 7A shows flip chip 70 in cross section taken along A—A. Flip chip 70 has a plurality of conductive bumps 72 interspersed with a plurality of non-conductive bump dams or bonding layer 74. Conductive bumps 72 make electrical connection between the chip and the next layer of circuitry. Conductive bumps 72 may comprise solder or conductive thermoplastic materials applied from the thermoplastic dispersion of this invention. Non-conductive bump dams or bonding layer 74 are formed by first applying the thermoplastic dispersion of this invention in the spaces between the conductive bumps, then drying and heating to form bump dams 74. Bump dams 74 provide stand-off from the board and prohibit solder flow (when conductive bumps comprise solder) from reaching adjacent bumps.

Figure 8:
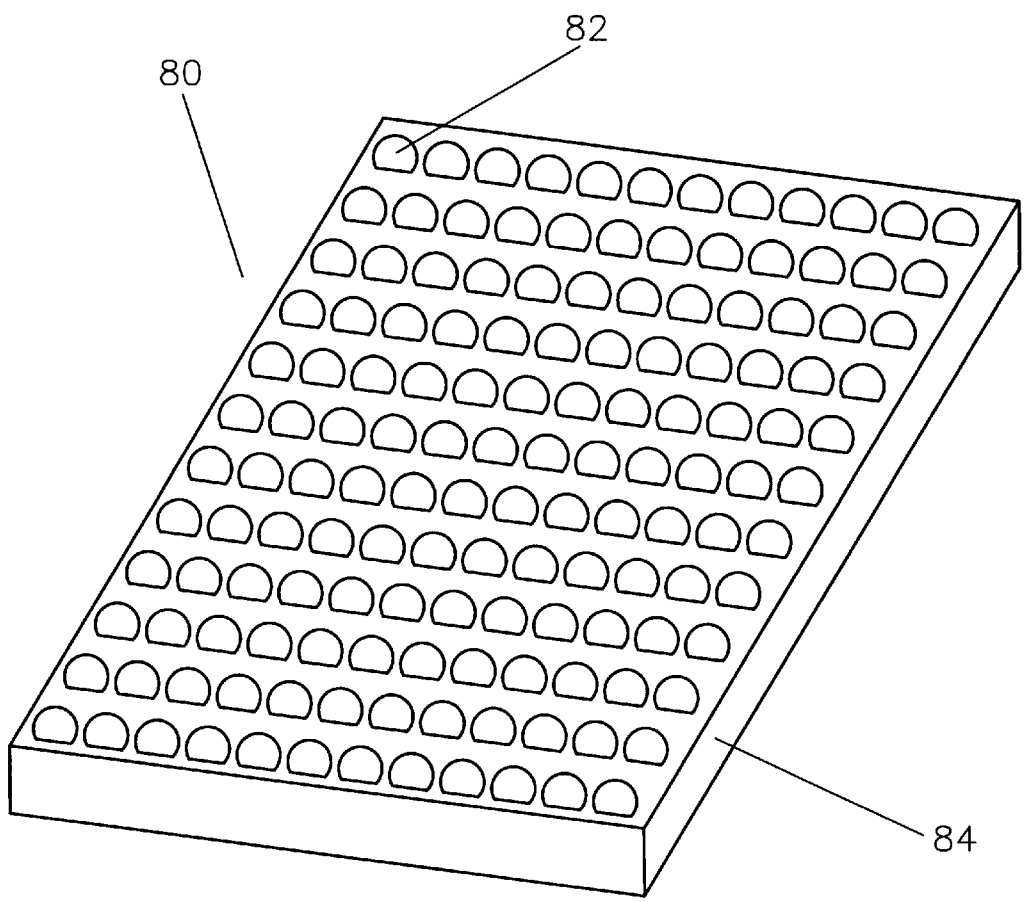
FIG. 8 is an illustrative diagram showing a ball grid array on an integrated circuit.

Referring now to FIG. 8, a plurality of conductive thermoplastic balls 82 makes up ball grid array 80 on surface 84 of an integrated circuit package. A thermoplastic dispersion having conductive filler therein is first used to deposit balls of dispersion on surface 84. The balls on surface 84 can be formed by stencil printing. The thermoplastic dispersion is dried to remove the liquid medium, and then heated to form a plurality of conductive thermoplastic balls 82. Ball grid array 80 on the integrated circuit package is then ready to be mounted on a circuit board (the conductive balls making contact with the circuit board).

Figure 9:
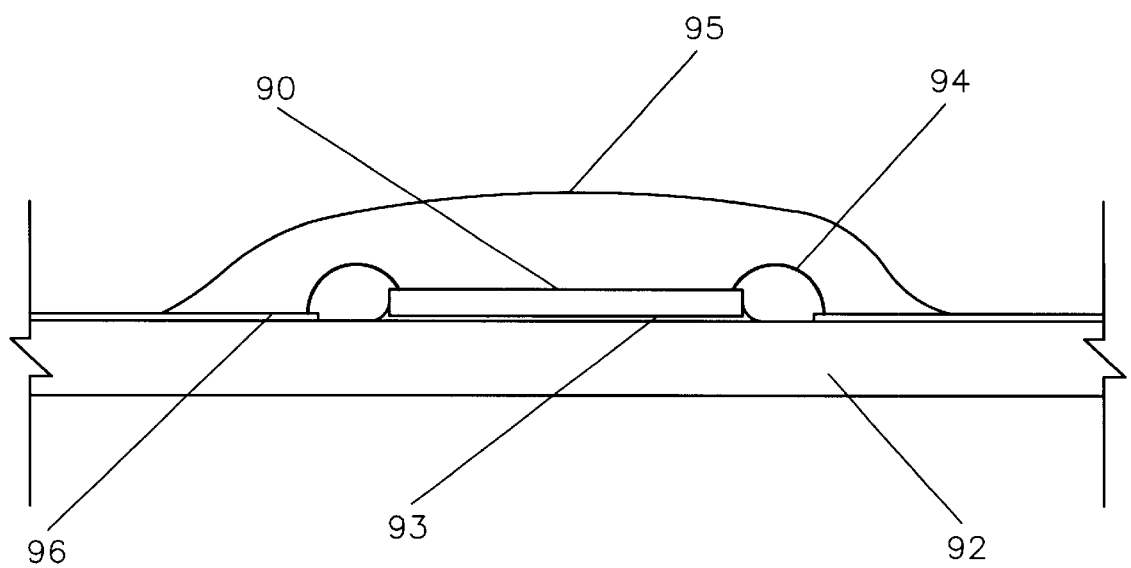
FIG. 9 is an illustrative diagram showing a protective coating over a die attached to a printed circuit board.

Referring now to FIG. 9, die 90 is shown attached to printed circuit board 92 by means of conductive die attach layer 93. Wire bond 94 connects the surface of die 90 to circuit trace 96 on printed circuit board 92. A layer of thermoplastic dispersion is applied to cover the die and wire bonds, then dried and heated to form protective coating 95. Protective coating 95 encapsulates die 90 and bonding wire 94, thus protecting them from damage.

Although the invention has been described above with particular reference to various embodiments thereof, variations and modifications of the present invention can be made within a contemplated scope of the following claims.

The foregoing detailed description has been given for clarity of understanding only. No unnecessary limitations are to be understood therefrom. The invention is not limited to the exact details shown and described, for variations obvious to one skilled in the art will be included within the invention defined by the claims. The complete disclosures of all patents, patent documents, and publications listed herein are incorporated by reference, as if each were individually incorporated by reference.

What is claimed is:

1. A method of applying a thermoplastic polymer to a semiconductor component comprising:

providing a dispersion comprising thermoplastic particles and a liquid medium;

applying the dispersion on the surface of the semiconductor component; and removing the liquid medium.

2. The method of claim 1 further including a step of applying heat to the thermoplastic particles to form a thermoplastic structure.

3. The method of claim 1 wherein the dispersion further comprises a filler.

4. The method of claim 1 wherein the dispersion further comprises liquid thermoset components.

5. The method of claim 1 wherein the thermoplastic particles are elastomeric.

6. The method of claim 1 wherein the thermoplastic particles comprise thermoplastic olefin rubber particles.

7. The method of claim 1 wherein the thermoplastic particles comprise a polymer selected from the group consisting of polyethylene, ethylene/vinylacetate, polypropylene, polystyrene, acrylonitrile-butadiene-styrene, poly(vinyl butyral), poly(vinyl chloride), polyimide, polyamide, poly(methyl methacrylate), poly(ethylene terephthalate), and cellulose acetate.

8. The method of claim 1 wherein the liquid medium is selected from the group consisting of water, organic solvents, and liquid thermoset components.

9. The method of claim 8 wherein the liquid medium is selected from the group consisting of water and alcohol.

10. A method of applying a thermoplastic polymer to a leadframe, the leadframe comprising lead fingers, the method comprising:
   applying a thermoplastic dispersion comprising thermoplastic particles and a liquid medium to the lead fingers; and
   removing the liquid medium.

11. A method of attaching a die to a leadframe, the leadframe comprising lead fingers, the method comprising:
   applying a thermoplastic dispersion comprising thermoplastic particles and a liquid medium to the lead fingers;
   removing the liquid medium;
   heating the thermoplastic particles to form a thermoplastic bonding layer; and
   placing a die against the bonding layer, thereby attaching the die to the leadframe.

12. A method of applying a thermoplastic polymer to a printed circuit board, the method comprising:
   applying a thermoplastic dispersion comprising thermoplastic particles and a liquid medium in a predetermined pattern to a printed circuit board; and
   removing the liquid medium.

13. A method of attaching a die to a printed circuit board, the method comprising:
   applying a thermoplastic dispersion comprising thermoplastic particles and a liquid medium in a predetermined pattern to a printed circuit board to produce an area to accept a die;
   removing the liquid medium;
   heating the thermoplastic particles to form a thermoplastic bonding layer; and
   placing the die against the bonding layer thereby attaching the die to the printed circuit board.

14. A method of sealing a flip chip on a printed circuit board, the flip chip comprising a plurality of conductive bumps, said method comprising:
   placing a flip chip on a printed circuit board, thus forming voids;
   applying a thermoplastic dispersion comprising thermoplastic particles and a liquid medium to the voids;
   removing the liquid medium; and
   heating the thermoplastic particles to form a thermoplastic underfill material thereby sealing the flip chip to the printed circuit board.

15. A method of applying a thermoplastic polymer to a flip chip, the flip chip comprising a plurality of conductive bumps and spaces between the bumps, the method comprising:
   applying a thermoplastic dispersion comprising thermoplastic particles and a liquid medium in the spaces between the bumps; and
   removing the liquid medium.

16. A method of making thermoplastic bump dams on a flip chip, the flip chip comprising a plurality of conductive bumps and spaces between the bumps, the method comprising:
   applying a thermoplastic dispersion comprising thermoplastic particles and a liquid medium in the spaces between the bumps;
   removing the liquid medium; and
   heating the thermoplastic particles to form thermoplastic bump dams.

17. A method of making an array, the array comprising a plurality of conductive thermoplastic deposits on the surface of a molded body of an integrated circuit package, the method comprising:
   applying a thermoplastic dispersion comprising thermoplastic particles and a liquid medium to form deposits;
   removing the liquid medium; and
   heating the thermoplastic particles to form conductive thermoplastic deposits.

18. A method of applying a thermoplastic polymer to a semiconductor component comprising:
   providing a dispersion comprising thermoplastic particles and a liquid medium wherein the thermoplastic particles are less than about 250 microns in diameter;
   applying the dispersion on the surface of the semiconductor component; and
   removing the liquid medium.

19. A method of applying a thermoplastic polymer to a semiconductor component comprising:
   providing a dispersion comprising thermoplastic particles and a liquid medium;
   coating the dispersion on the surface of the semiconductor component; and
   removing the liquid medium.

20. A semiconductor component prepared by the method of claim 1.

21. A leadframe comprising lead fingers prepared by the method of claim 10.

22. A printed circuit board prepared by the method of claim 12.

23. A flip chip comprising a plurality of conductive bumps and spaces between the bumps prepared by the method of claim 15.

24. A flip chip mounted on a printed circuit board having voids between the flip chip and the printed circuit board prepared by the method of claim 14.

* * * * *